(12) United States Patent
Chang et al.

(10) Patent No.: US 10,275,082 B2
(45) Date of Patent: *Apr. 30, 2019

(54) INTELLIGENT HYBRID TOUCH DISPLAY DEVICE

(71) Applicant: YICHENG PRECISION INC., Tainan (TW)

(72) Inventors: Jen-Chieh Chang, Taipei (TW); Chung-Lin Chia, Taipei (TW); Han-Chang Chen, Taipei (TW); Yen-Hung Tu, Taipei (TW); Chih-Wen Wu, Taipei (TW)

(73) Assignee: YICHENG PRECISION INC., Tainan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/694,402

(22) Filed: Sep. 1, 2017

(65) Prior Publication Data

US 2017/0364205 A1 Dec. 21, 2017

Related U.S. Application Data

(63) Continuation-in-part of application No. 14/956,178, filed on Dec. 1, 2015, now Pat. No. 9,787,307.

(51) Int. Cl.
*H03K 17/94* (2006.01)
*H03M 11/00* (2006.01)
(Continued)

(52) U.S. Cl.
CPC ............ *G06F 3/0416* (2013.01); *G06F 3/038* (2013.01); *G06F 3/0362* (2013.01); *G06F 3/044* (2013.01); *G06F 3/0412* (2013.01); *H01H 13/83* (2013.01); *H03K 17/962* (2013.01); *G06F 3/042* (2013.01); *G06F 3/043* (2013.01); *G06F 3/045* (2013.01); *G06F 2203/04101* (2013.01); *G06F 2203/04106* (2013.01); *H01H 25/065* (2013.01); *H01H 2219/012* (2013.01); *H01H 2219/016* (2013.01); *H01H 2221/01* (2013.01); *H01H 2221/018* (2013.01); *H01H 2239/074* (2013.01);
(Continued)

(58) Field of Classification Search
CPC ..... H03K 17/962; G06F 3/0412; G06F 3/044; H01H 13/83; H01H 25/065
USPC ...................................................... 341/22–35
See application file for complete search history.

(56) References Cited

U.S. PATENT DOCUMENTS 9,787,307 B2 * 10/2017 Chang .................. H03K 17/962

* cited by examiner

*Primary Examiner* — Muhammad N Edun
*Assistant Examiner* — Jerold B Murphy
(74) *Attorney, Agent, or Firm* — Guice Patents PLLC

(57) ABSTRACT

An intelligent hybrid touch display device, including: a touch display unit; a rotary mechanical switch, being integrated with the touch display unit in a body; and a control unit, located in the body and including: a first interface for driving the touch display unit; a second interface coupled with the rotary mechanical switch; a touch and switch detection unit coupled with the first interface and the second interface; a transmission interface for communicating with at least one external device; and a processor and an operating system stored in a memory, the processor being coupled with the touch and switch detection unit and the transmission interface, and being used for executing a control program with a support of the operating system, so that the touch display unit and the rotary mechanical switch can cooperate to provide a hybrid operation for selecting, changing or activating function options.

20 Claims, 18 Drawing Sheets

(51) Int. Cl.
H01H 67/26 (2006.01)
G06F 3/02 (2006.01)
G09G 5/00 (2006.01)
G06F 3/041 (2006.01)
G06F 3/0362 (2013.01)
G06F 3/038 (2013.01)
G06F 3/044 (2006.01)
H01H 13/83 (2006.01)
H03K 17/96 (2006.01)
G06F 3/043 (2006.01)
G06F 3/045 (2006.01)
G06F 3/042 (2006.01)
H01H 25/06 (2006.01)

(52) U.S. Cl.
CPC .............. *H03K 2217/94036* (2013.01); *H03K 2217/94057* (2013.01); *H03K 2217/96031* (2013.01)

INTELLIGENT HYBRID TOUCH DISPLAY DEVICE

INCORPORATION BY REFERENCE

This is a continuation in part application to application Ser. No. 14/956,178 "HYBRID TOUCH BUTTON AND MODULE USING THE SAME" which was filed on Dec. 1, 2015, and which is incorporated herein by reference in its entirety.

BACKGROUND OF THE INVENTION

Field of the Invention

The present invention relates to a button device, especially to an intelligent hybrid touch display device.

Description of the Related Art

Please refer to FIG. 1, which illustrates an outline of a mechanical button with lamp of prior art. As illustrated in FIG. 1, the mechanical button with lamp of prior art includes a body 10, a pressing part 20, and a plurality of switch pins 30, wherein the pressing part 20 has a lamp and the interconnection of the plurality of switch pins 30 is determined via a plurality of mechanical connection structures.

However, when the number of the plurality of mechanical connection structures increases, the reliability of the mechanical button with lamp of prior art will decrease. Besides, when the interconnection of the plurality of switch pins 30 is to be changed, a new mold will be required to manufacture the required product, which will cause much inconvenience.

To solve the foregoing problem, a novel intelligent hybrid touch display device is needed.

SUMMARY OF THE INVENTION

One objective of the present invention is to disclose a hybrid touch button, which is capable of reducing the number of mechanical contacts thereof.

Another objective of the present invention is to disclose a hybrid touch button, which is capable of changing the interconnection structure by software programming.

Another objective of the present invention is to disclose a hybrid touch button, which is capable of providing both a long operational life and a mechanical touch.

Another objective of the present invention is to disclose a hybrid touch button, which is capable of achieving high noise immunity by providing digital activating signals.

Another objective of the present invention is to disclose an intelligent hybrid touch display device, which is capable of providing an on-line-update function for updating an internal control program of a button.

Still another objective of the present invention is to disclose an intelligent hybrid touch display device, which is capable of being used to implement an intelligent wearable device, an intelligent vehicle control device, or an intelligent IOT (internet of things) device.

To attain the foregoing objectives, a hybrid touch button is proposed, including:

a touch display unit having a touch display area;

a mechanical switch having a plurality of conductive contacts; and a control unit, having a power interface for coupling with a power source, a first interface coupled with the touch display area, a second interface coupled with the plurality of conductive contacts, and an output interface, wherein the control unit derives first input information from the first interface and second input information from the second interface, and determines an output configuration of the output interface according to the first input information and the second input information.

In one embodiment, the touch display unit includes a display layer and a touch sensing layer, the display layer being selected from a group consisting of a liquid crystal display layer, an organic light emitting diode display layer, a polymer light emitting diode display layer, and an electronic paper display layer, and the touch sensing layer being glued to or integrated with the display layer.

In one embodiment, the touch display unit includes a display layer and a touch sensing layer, the display layer being selected from a group consisting of a liquid crystal display layer, an organic light emitting diode display layer, a polymer light emitting diode display layer, and an electronic paper display layer, and the touch sensing layer being embedded in the display layer or implemented by display electrodes of the display layer.

In one embodiment, the mechanical switch is selected from a group consisting of a pushbutton switch, a rocker switch, a band switch, and any combination thereof.

In one embodiment, the output configuration includes determining a conduction state between at least two pins of the output interface.

In one embodiment, the output configuration includes providing at least one digital activating signal via at least two pins of the output interface.

In one embodiment, the hybrid touch button further includes at least one switch, by which at least one contact of the plurality of conductive contacts can be connected to the output interface when the power source is disrupted.

In one embodiment, the hybrid touch button further includes at least one manual switch for a user to force at least one contact of the plurality of conductive contacts to be connected with the output interface.

In one embodiment, the hybrid touch button further includes an auxiliary capacitor circuit for isolating a display circuit of the touch display unit and supplying power to the display circuit to maintain a display state when the control unit performs a touch detection procedure, wherein the touch detection procedure is selected from a group consisting of a self-capacitive touch detection procedure, a mutual-capacitive touch detection procedure, and a hybrid-signal touch detection procedure.

To attain the foregoing objectives, a hybrid touch module is proposed, including:

a plurality of hybrid touch buttons, each having a touch display unit and a mechanical switch, wherein the touch display unit has a touch display area, and the mechanical switch has a plurality of conductive contacts;

a central control unit coupled with the plurality of hybrid touch buttons, having a power interface for coupling with a power source, a first interface for driving the touch display area of each of the plurality of hybrid touch buttons, a second interface coupled with the plurality of conductive contacts of the mechanical switch of each of the plurality of hybrid touch buttons, and an output interface, wherein the central control unit derives first input information from the first interface and second input information from the second interface, and determines an output configuration of the output interface according to the first input information and the second input information; and a plurality of objects coupled with the output interface of the central control unit.

To attain the foregoing objectives, another hybrid touch module is proposed, including:

a plurality of hybrid touch buttons, each including:

a touch display unit having a touch display area;

a mechanical switch having a plurality of conductive contacts; and a control unit, having a power interface for coupling with a power source, a first interface for driving the touch display area, a second interface coupled with the plurality of conductive contacts, and an output interface, wherein the control unit derives first input information from the first interface and second input information from the second interface, and determines an output configuration of the output interface according to the first input information and the second input information;

a central control unit coupled with the plurality of hybrid touch buttons; and a plurality of objects coupled with the central control unit;

wherein the central control unit receives touch operation information from the plurality of hybrid touch buttons and controls the plurality of objects according to the touch operation information.

To attain the foregoing objective, an intelligent hybrid touch display device is proposed for implementing an intelligent device, including:

a touch display unit, having a touch display area;

a rotary mechanical switch, which is a band switch or a jog dial switch, being integrated with the touch display unit in a body and having at least one conductive contact; and a control unit, located in the body and including:

a first interface for driving the touch display area;

a second interface for coupling with the at least one conductive contact;

a touch and switch detection unit coupled with the first interface and the second interface;

a transmission interface for communicating with at least one external device; and a processor and an operating system stored in a memory, the processor being coupled with the touch and switch detection unit and the transmission interface, and being used for executing a control program with a support of the operating system, so that the touch display unit and the rotary mechanical switch can cooperate to provide a hybrid operation, which includes a rotation operation provided by the rotary mechanical switch and a touch (or hover) operation provided by the touch display unit, the hybrid operation being used for switching pictures, selecting functions, inputting commands, setting parameters, or executing selected functions.

In one embodiment, the transmission interface communicates with the at least one external device in a wired or wireless way.

In one embodiment, the operating system has an on-line-update function for receiving a program file from one of the at least one external device to establish or update the control program.

In one embodiment, the control program includes a pixel data outputting procedure to make the touch display unit display at least one operation picture, and/or to drive a display screen of at least one of the at least one external device via the transmission interface.

In one embodiment, the processor and the touch and switch detection unit are located in separate integrated circuits.

In one embodiment, the processor and the touch and switch detection unit are integrated in one integrated circuit.

In one embodiment, the touch display area includes a display layer selected from a group consisting of an active-matrix liquid crystal display layer, a passive-matrix liquid crystal display layer, an active-matrix organic light emitting diode display layer, a passive-matrix organic light emitting diode display layer, an active-matrix quantum-dot light emitting diode display layer, a passive-matrix quantum-dot light emitting diode display layer, an active-matrix micro light emitting diode display layer, a passive-matrix micro light emitting diode display layer, an active-matrix electronic paper display layer, and a passive-matrix electronic paper display layer.

In one embodiment, the touch display unit includes a capacitive touch sensing layer or a resistive touch sensing layer stacked on the display layer.

In one embodiment, the touch display unit includes a capacitive touch sensing structure, a photo-type sensing structure, or an acoustic touch sensing structure embedded in a display structure of the display layer.

In one embodiment, the intelligent device is an intelligent wearable device.

In one embodiment, the intelligent device is an intelligent vehicle control device.

In one embodiment, the intelligent device is an intelligent IOT device.

To attain the foregoing objectives, another intelligent hybrid touch display device is proposed for implementing an intelligent device, the intelligent hybrid touch display device including:

a touch display unit, including a touch display area for display at least one picture according to a plurality of pixel data;

a rotary mechanical switch, which is a band switch or a jog dial switch, being integrated with the touch display unit in a body and having at least one conductive contact;

a control unit, located in the body and including: a first interface for driving the touch display area; a second interface coupled with the at least one conductive contact; a touch and switch detection unit coupled with the first interface and the second interface; and a processor, being coupled with the touch and switch detection unit for executing a control program so that the touch display unit and the rotary mechanical switch can cooperate to provide a hybrid operation; and a central processing unit, located in the body and having a transmission interface and an operating system stored in a memory, the transmission interface being used for communicating with at least one external device in a wired or wireless way;

wherein the hybrid operation includes a rotation operation provided by the rotary mechanical switch and a touch (or hover) operation provided by the touch display unit, the rotation operation being used for selecting a function option, and the touch (or hover) operation being used for activating the function option; and the central processing unit operates with a support of the operating system to transmit the plurality of pixel data and/or the control program to the control unit, generate an output configuration according to the hybrid operation detected by the control unit, and output the output configuration via the transmission interface to control at least one of the at least one external device.

In one embodiment, the transmission interface communicates with the at least one external device in a wired or wireless way.

In one embodiment, the control unit and the central processing unit are located in separate integrated circuits.

In one embodiment, the control unit and the central processing unit are integrated in one integrated circuit.

In one embodiment, the touch display area includes a display layer selected from a group consisting of an active-matrix liquid crystal display layer, a passive-matrix liquid crystal display layer, an active-matrix organic light emitting diode display layer, a passive-matrix organic light emitting diode display layer, an active-matrix quantum-dot light emitting diode display layer, a passive-matrix quantum-dot light emitting diode display layer, an active-matrix micro light emitting diode display layer, a passive-matrix micro light emitting diode display layer, an active-matrix electronic paper display layer, and a passive-matrix electronic paper display layer.

In one embodiment, the touch display unit includes a capacitive touch sensing layer or a resistive touch sensing layer stacked on the display layer.

In one embodiment, the touch display unit includes a capacitive touch sensing structure, a photo-type sensing structure, or an acoustic touch sensing structure embedded in a display structure of the display layer.

In one embodiment, the intelligent device is an intelligent wearable device.

In one embodiment, the intelligent device is an intelligent vehicle control device.

In one embodiment, the intelligent device is an intelligent IOT device.

To attain the foregoing objectives, still another intelligent hybrid touch display device is proposed for implementing an intelligent device, the intelligent hybrid touch display device including:

a touch display unit, including a touch display area for display at least one picture according to a plurality of pixel data;

a rotary mechanical switch, which is a band switch or a jog dial switch, being integrated with the touch display unit in a body and having at least one conductive contact;

a control unit, located in the body and including: a first interface for driving the touch display area; a second interface coupled with the at least one conductive contact; a touch and switch detection unit coupled with the first interface and the second interface; and a processor and a first operating system stored in a first memory, the processor being coupled with the touch and switch detection unit for executing a control program with a support of the first operating system so that the touch display unit and the rotary mechanical switch can cooperate to provide a hybrid operation; and a central processing unit, located in the body and having a transmission interface and a second operating system stored in a second memory, the transmission interface being used for communicating with at least one external device in a wired or wireless way;

wherein the hybrid operation includes a rotation operation provided by the rotary mechanical switch and a touch (or hover) operation provided by the touch display unit, the rotation operation being used for selecting a function option, and the touch (or hover) operation being used for activating the function option; and the central processing unit operates with a support of the second operating system to transmit the plurality of pixel data and/or the control program to the control unit, generate an output configuration according to the hybrid operation detected by the control unit, and output the output configuration via the transmission interface to control at least one of the at least one external device.

In one embodiment, the touch display area includes a display layer selected from a group consisting of an active-matrix liquid crystal display layer, a passive-matrix liquid crystal display layer, an active-matrix organic light emitting diode display layer, a passive-matrix organic light emitting diode display layer, an active-matrix quantum-dot light emitting diode display layer, a passive-matrix quantum-dot light emitting diode display layer, an active-matrix micro light emitting diode display layer, a passive-matrix micro light emitting diode display layer, an active-matrix electronic paper display layer, and a passive-matrix electronic paper display layer.

In one embodiment, the touch display unit includes a capacitive touch sensing layer or a resistive touch sensing layer stacked on the display layer.

In one embodiment, the touch display unit includes a capacitive touch sensing structure, a photo-type sensing structure, or an acoustic touch sensing structure embedded in a display structure of the display layer.

In one embodiment, the intelligent device is an intelligent wearable device.

In one embodiment, the intelligent device is an intelligent vehicle control device.

In one embodiment, the intelligent device is an intelligent IOT device.

To make it easier for our examiner to understand the objective of the invention, its structure, innovative features, and performance, we use preferred embodiments together with the accompanying drawings for the detailed description of the invention.

DETAILED DESCRIPTION OF THE PREFERRED EMBODIMENTS

Figure 1:
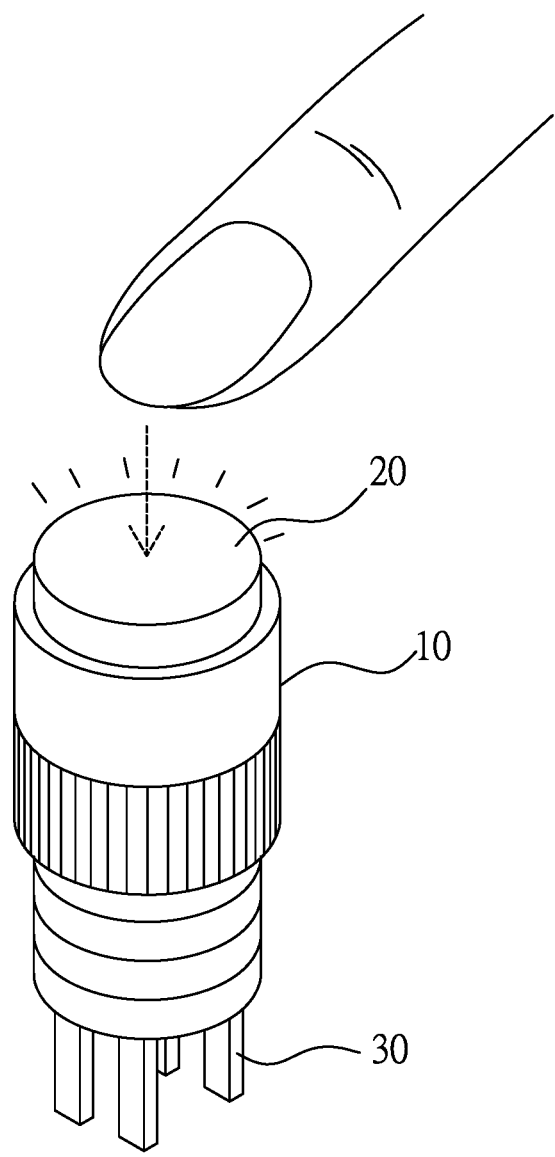
FIG. 1 illustrates an outline of a mechanical button with lamp of prior art.
Figure 2:
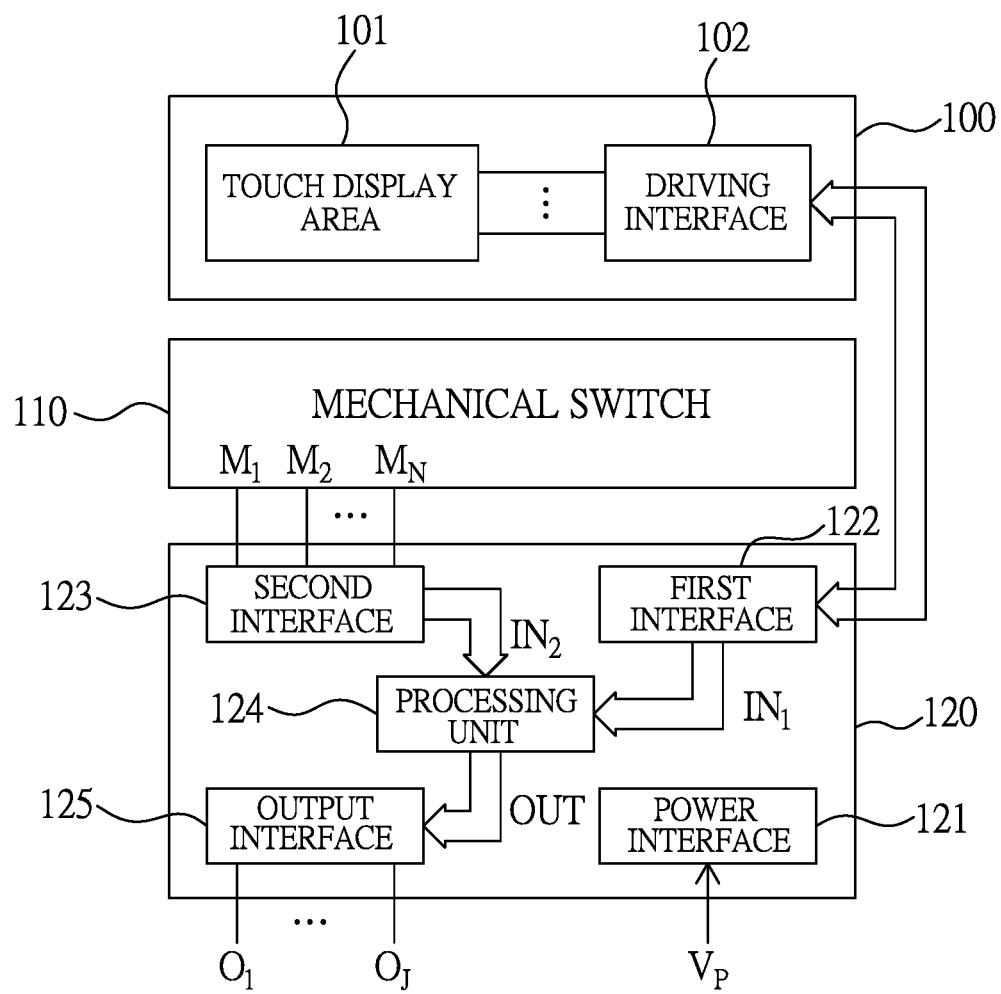
FIG. 2 illustrates an embodiment of a hybrid touch button of the present invention.

Please refer to FIG. 2, which illustrates an embodiment of a hybrid touch button of the present invention. As illustrated in FIG. 2, the hybrid touch button includes a touch display unit 100, a mechanical switch 110, and a control unit 120.

The touch display unit 100 has a touch display area 101 and a driving interface 102. The touch display area 101 includes a display layer and a touch sensing layer (not shown in the figure), the display layer can be a liquid crystal display layer, an organic light emitting diode display layer, a polymer light emitting diode display layer, or an electronic paper display layer, and the touch sensing layer can be glued to or integrated with the display layer, or embedded in the display layer or implemented by display electrodes of the display layer. The driving interface 102 is used to drive the touch display area 101 to provide a touch display function according to at least one pixel driving signal and at least one touch detection signal. Besides, the driving interface 102 is not limited to being located inside the touch display unit 100, it can also be located inside the control unit 120.

The mechanical switch 110 has a plurality of conductive contacts $M_1$-$M_N$, and can be a pushbutton switch, a rocker switch, a band switch, or any combination thereof.

The control unit 120 has a power interface 121, a first interface 122, a second interface 123, a processing unit 124, and an output interface 125, wherein, the power interface 121 is for coupling with a power source $V_P$; the first interface 122 is coupled with the driving interface 102; the second interface 123 is coupled with the plurality of conductive contacts $M_1$-$M_N$; and the processing unit 124 derives first input information $IN_1$ from the first interface 122 and second input information $IN_2$ from the second interface 123, and generates at least one output control signal OUT to determine an output configuration of connection pins $O_1$-$O_J$ of the output interface 125 according to the first input information $IN_1$ and the second input information $IN_2$, wherein the output configuration can determine a conduction state between at least two pins of the connection pins $O_1$-$O_J$, or provide at least one digital activating signal via at least two pins of the connection pins $O_1$-$O_J$.

Figure 3:
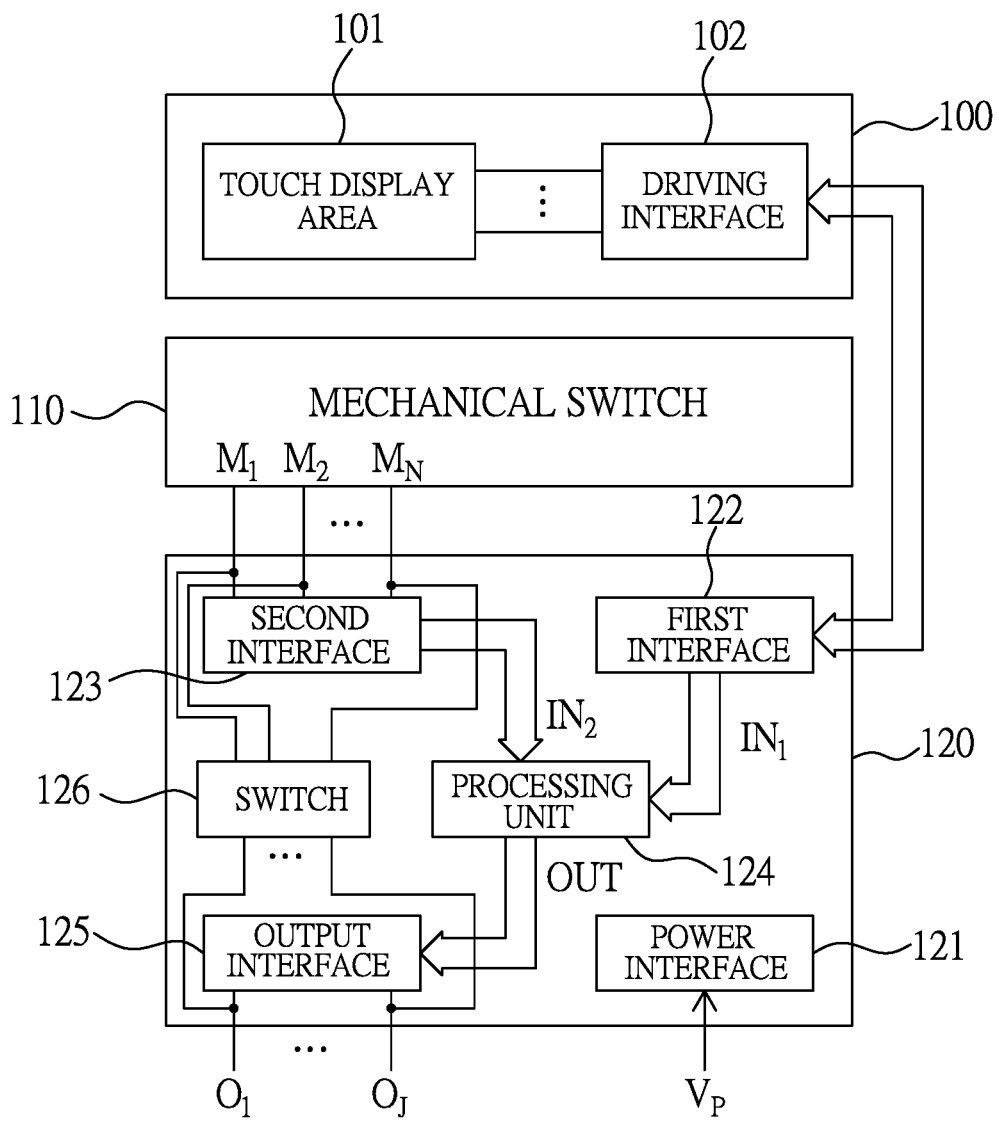
FIG. 3 illustrates another embodiment of a hybrid touch button of the present invention.

Please refer to FIG. 3, which illustrates another embodiment of a hybrid touch button of the present invention. As illustrated in FIG. 3, the hybrid touch button includes a touch display unit 100, a mechanical switch 110, and a control unit 120.

As the functions of the touch display unit 100 and the mechanical switch 110 have been described with reference to FIG. 2 above, they will not be readdressed.

The control unit 120 has a power interface 121, a first interface 122, a second interface 123, a processing unit 124, an output interface 125, and a switch 126.

As the functions of the power interface 121, the first interface 122, the second interface 123, the processing unit 124 and the output interface 125 have been described with reference to FIG. 2 above, they will not be readdressed.

The switch 126 can include at least one relay to connect at least one contact of the conductive contacts $M_1$-$M_N$ to the output interface 125 when the power source $V_P$ is disrupted.

Figure 4A:
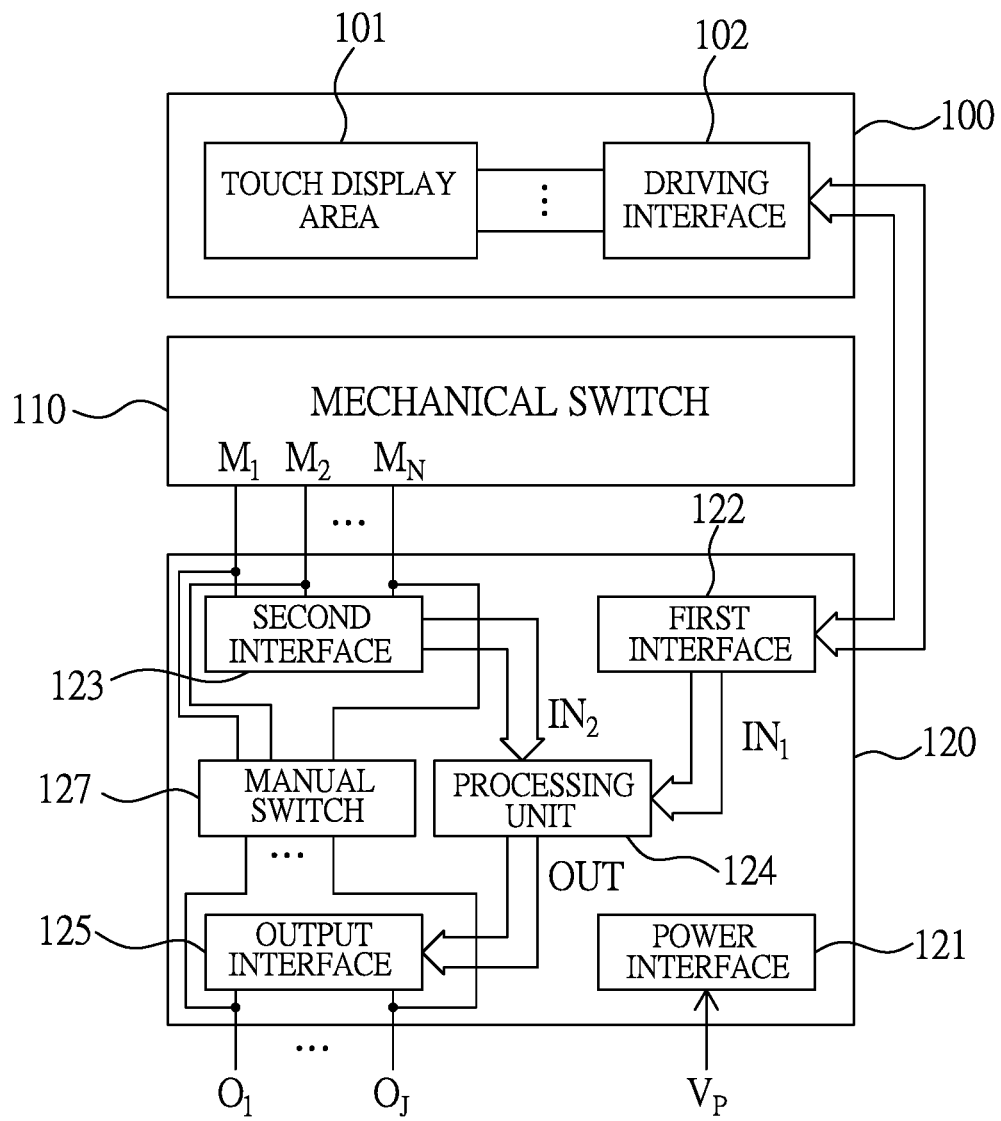
FIG. 4a illustrates another embodiment of a hybrid touch button of the present invention.

Please refer to FIG. 4a, which illustrates another embodiment of a hybrid touch button of the present invention. As illustrated in FIG. 4a, the hybrid touch button includes a touch display unit 100, a mechanical switch 110, and a control unit 120.

As the functions of the touch display unit 100 and the mechanical switch 110 have been described with reference to FIG. 2 above, they will not be readdressed.

The control unit 120 has a power interface 121, a first interface 122, a second interface 123, a processing unit 124, an output interface 125, and a manual switch 127.

As the functions of the power interface 121, the first interface 122, the second interface 123, the processing unit 124 and the output interface 125 have been described with reference to FIG. 2 above, they will not be readdressed.

Figure 4B:
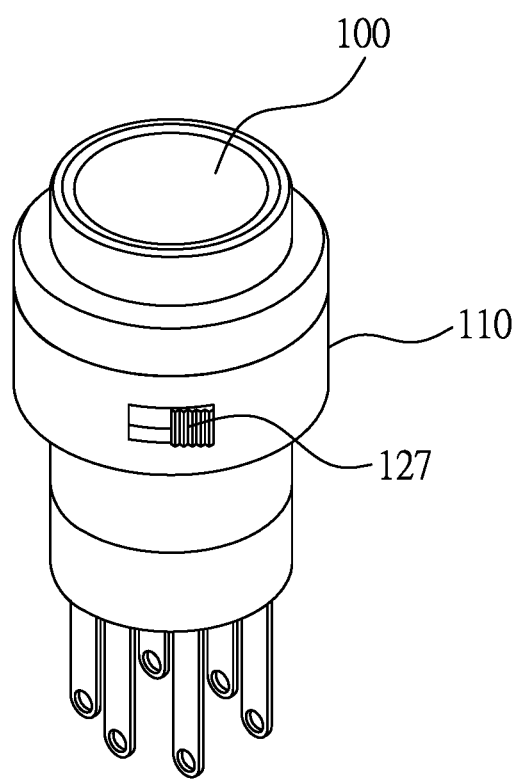
FIG. 4b illustrates an outline of the hybrid touch button of FIG. 4a having a DIP (dual in line package) switch for manual operation.

The manual switch 127 is used for a user to force at least one contact of the conductive contacts $M_1$-$M_N$ of the mechanical switch 110 to be connected with the output interface 125. Please refer to FIG. 4b, which illustrates an outline of the hybrid touch button of FIG. 4a having a DIP (dual in line package) switch for manual operation. With this design, a user can force the mechanical switch 110 to be connected with the output interface 125 via operating the DIP switch.

Figure 5:
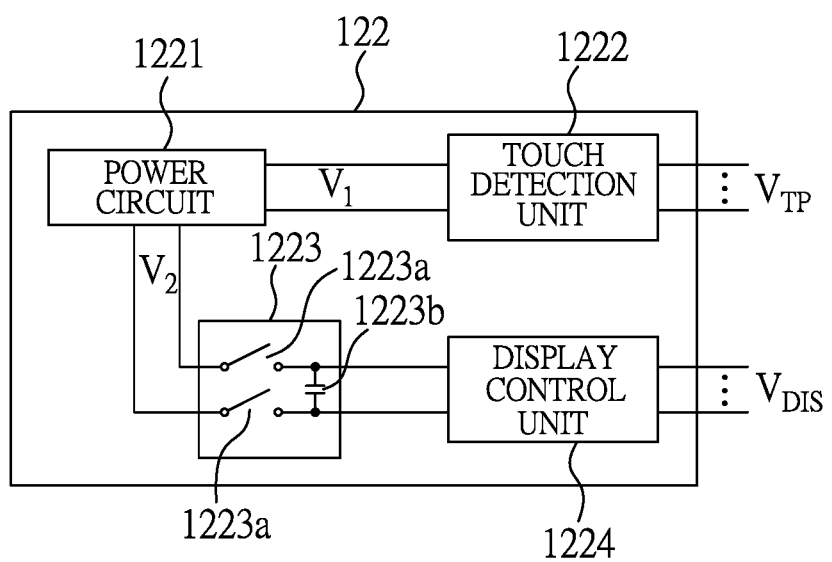
FIG. 5 illustrates an embodiment of the first interface of FIG. 2-4.

Besides, by adding an auxiliary capacitor circuit into the first interface 122, when the first interface 122 performs a touch detection procedure, the touch detection procedure can be free of interference from a display driving circuit. Please refer to FIG. 5, which illustrates an embodiment of the first interface of FIG. 2-4. As illustrated in FIG. 5, the first interface 122 includes a power circuit 1221, a touch detection unit 1222, an auxiliary capacitor circuit 1223, and a display control unit 1224.

The power circuit 1221 is used for providing a DC voltage $V_1$ to the touch detection unit 1222, and a DC voltage $V_2$ to the display control unit 1224.

The touch detection unit 1222 is powered by the DC voltage $V_1$ to deliver at least one touch detection signal $V_{TP}$ for performing a touch detection procedure, wherein the touch detection procedure is selected from a group consisting of a self-capacitive touch detection procedure, a mutual-capacitive touch detection procedure, and a hybrid-signal touch detection procedure. During the hybrid-signal touch detection procedure, the touch detection signal $V_{TP}$ is a hybrid signal of a DC voltage and an AC voltage.

The auxiliary capacitor circuit 1223 includes two switches 1223a and an auxiliary capacitor 1223b, wherein the auxiliary capacitor 1223b is used to store electric power, and the switches 1223a are used to disrupt the electric connection between the DC voltage $V_2$ and the display control unit 1224 when the touch detection unit 1222 performs the touch detection procedure, so as to isolate a display circuit including the display control unit 1224 and the display layer, and meanwhile the auxiliary capacitor 1223b will supply power to the display control unit 1224 to maintain a display function. That is, when the switches 1223a are turned on, the display control unit 1224 is powered by the DC voltage $V_2$ to deliver at least one pixel driving signal $V_{DIS}$ to perform a display driving procedure; when the switches 1223a are turned off, the display control unit 1224 is powered by the auxiliary capacitor 1223b to deliver at least one pixel driving signal $V_{DIS}$ to perform the display driving procedure.

Figure 6A:
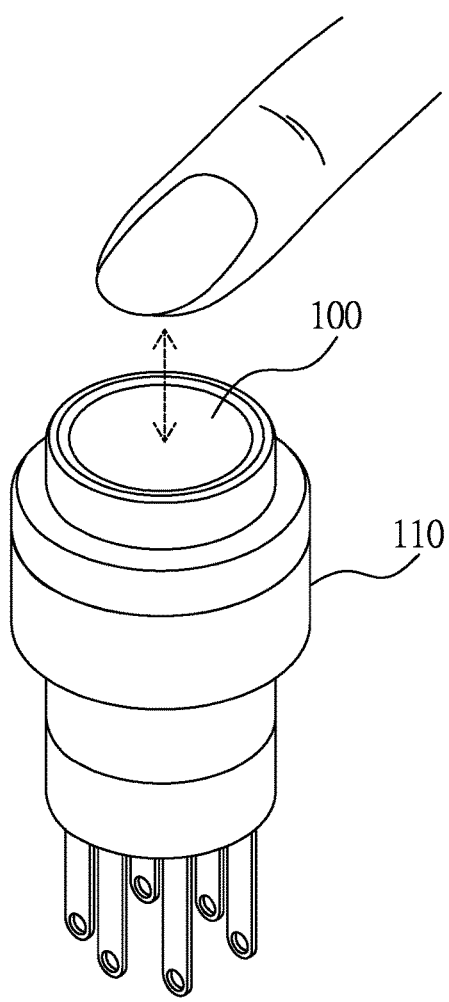
FIG. 6a-6b illustrates a hybrid operation on a hybrid touch button including a pushbutton switch of the present invention.
Figure 6B:
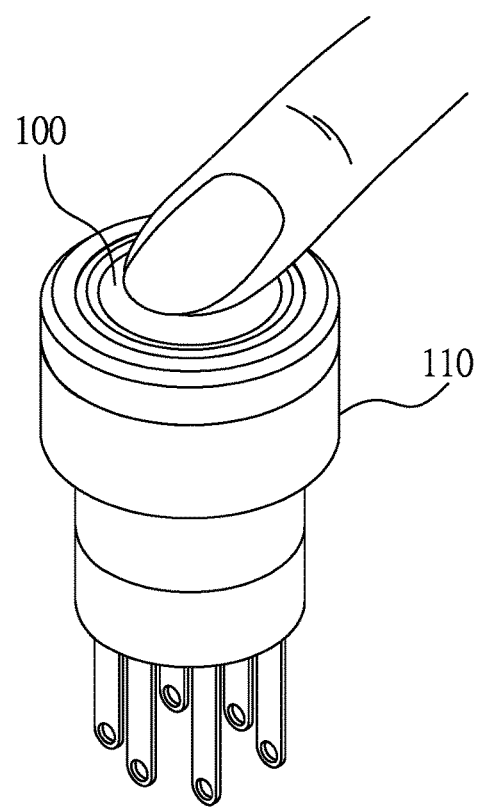

Please refer to FIG. 6a-6b, which illustrates a hybrid operation on a hybrid touch button including a pushbutton switch of the present invention, wherein FIG. 6a illustrates a touch (or hover) operation; FIG. 6b illustrates a press operation. The touch (or hover) operation can be used to choose a function option, and the press operation can be used to activate the function option.

Figures 7A, 7B:
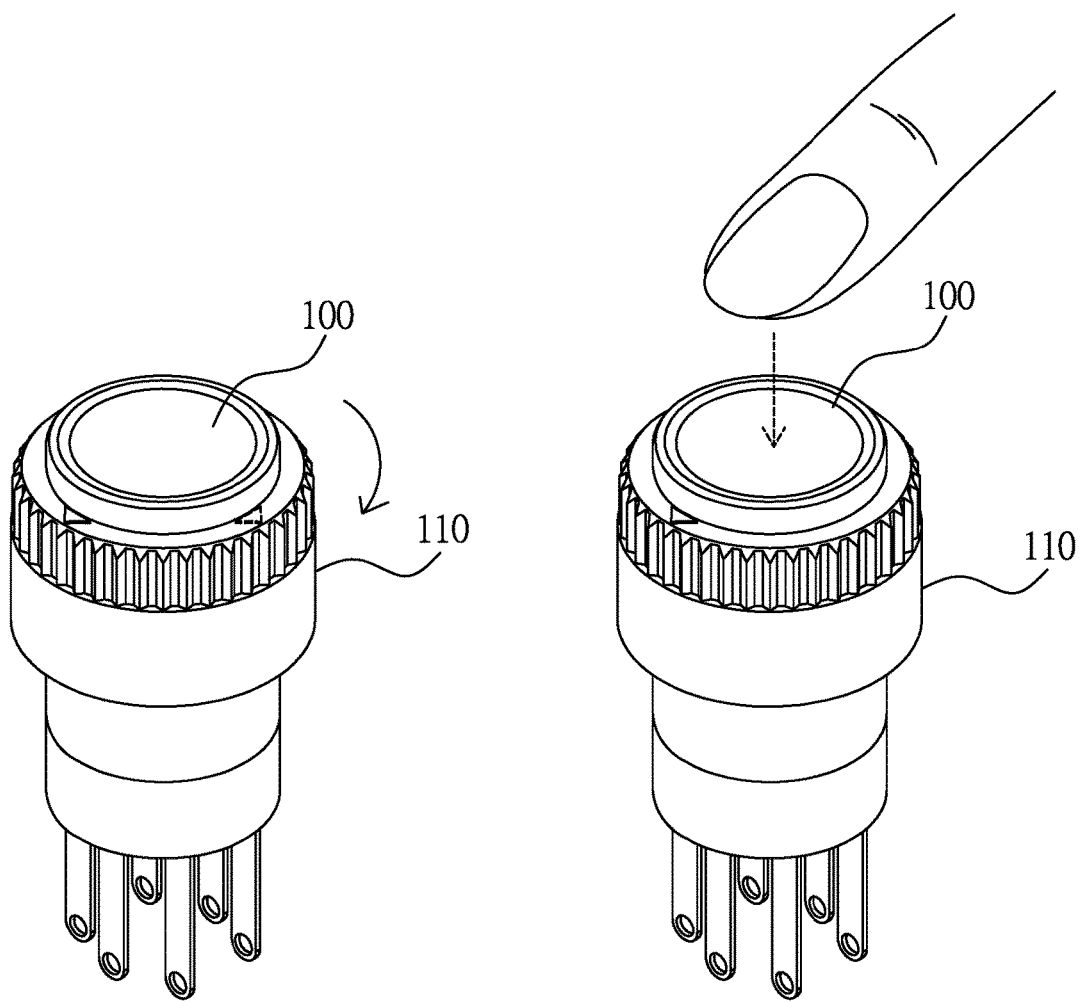
FIG. 7a-7b illustrates a hybrid operation on a hybrid touch button including a band switch of the present invention.

Please refer to FIG. 7a-7b, which illustrates a hybrid operation on a hybrid touch button including a band switch of the present invention, wherein FIG. 7a illustrates a rotation operation; FIG. 7b illustrates a touch (or hover) operation. The rotation operation can be used to choose a function option, and the touch (or hover) operation can be used to activate the function option.

Figure 8A:
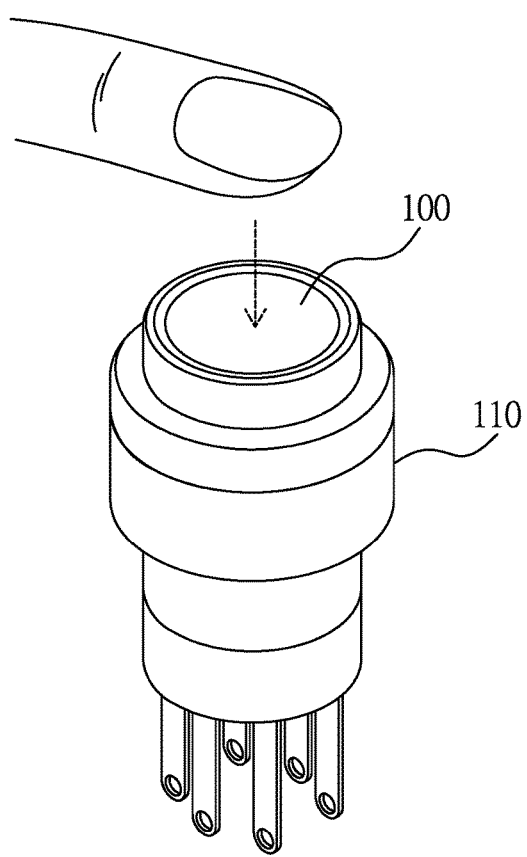
FIG. 8a-8b illustrates a hybrid operation on a hybrid touch button including a rocker switch of the present invention.
Figure 8B:
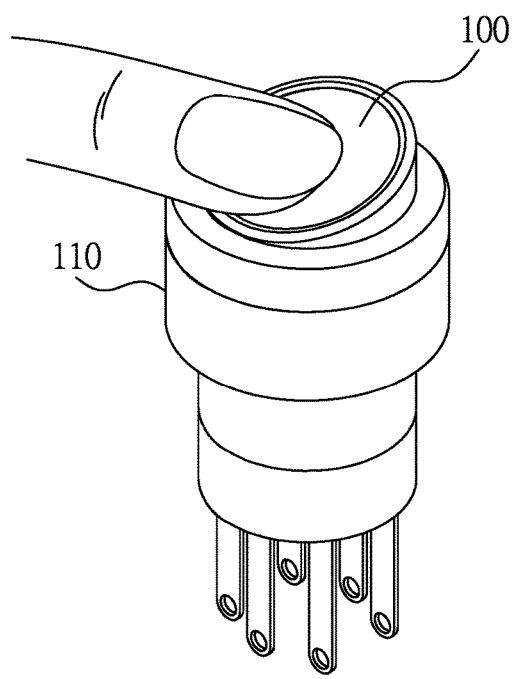

Please refer to FIG. 8a-8b, which illustrates a hybrid operation on a hybrid touch button including a rocker switch of the present invention, wherein FIG. 8a illustrates a touch (or hover) operation; FIG. 8b illustrates a press operation. The touch (or hover) operation can be used to choose a function option, and the press operation can be used to activate the function option.

Figures 9A, 9B:
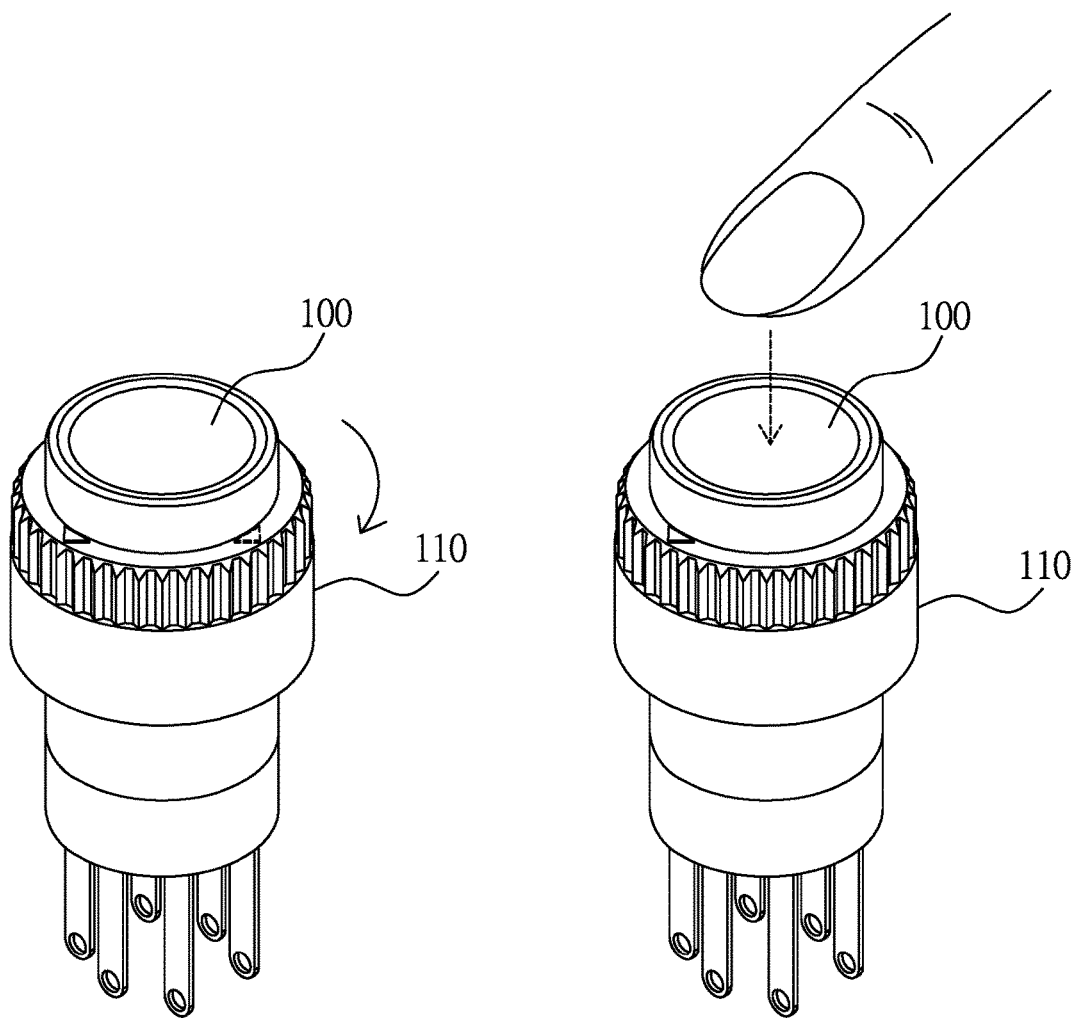
FIG. 9a-9c illustrates a hybrid operation on a hybrid touch button including a band switch and a pushbutton switch of the present invention.
Figure 9C:
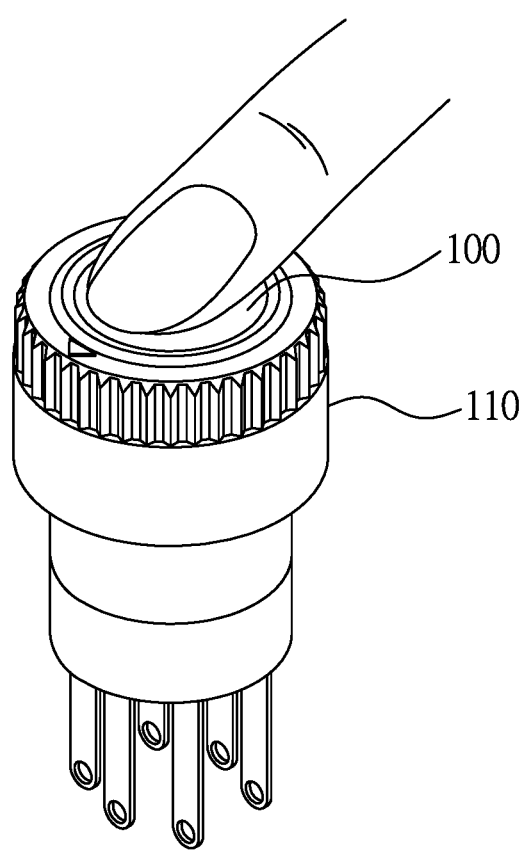

Please refer to FIG. 9a-9c, which illustrates a hybrid operation on a hybrid touch button including a band switch and a pushbutton switch of the present invention, wherein FIG. 9a illustrates a rotation operation; FIG. 9b illustrates a touch (or hover) operation; and FIG. 9c illustrates a press operation. The rotation operation and the touch (or hover) operation can be used to choose a function option, and the press operation can be used to activate the function option.

Figure 10:
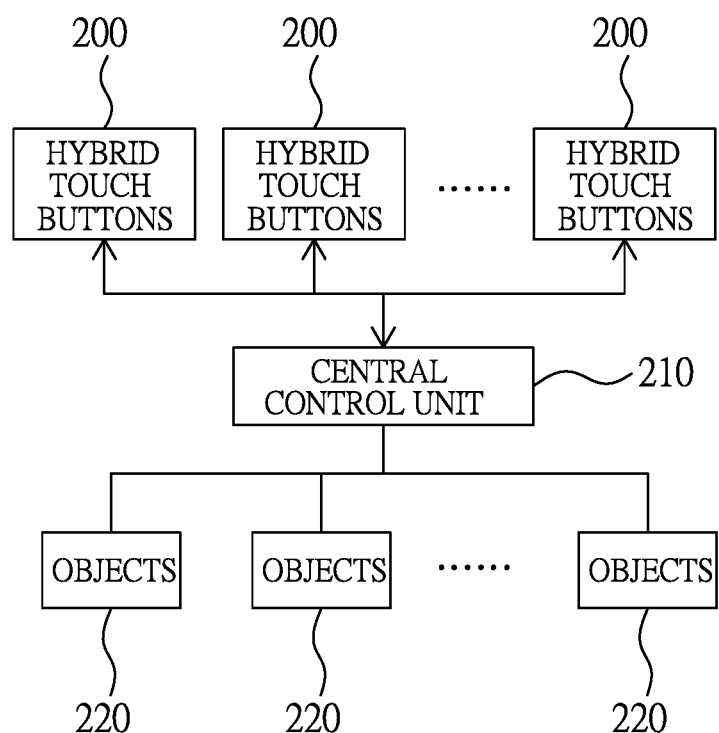
FIG. 10 illustrates a block diagram of an embodiment of a hybrid touch module of the present invention.

Based on the principles elaborated above, the present invention further proposes a hybrid touch module, which includes a plurality of hybrid touch buttons. Please refer to FIG. 10, which illustrates a block diagram of an embodiment of a hybrid touch module of the present invention. As illustrated in FIG. 10, the hybrid touch module includes a plurality of hybrid touch buttons 200, a central control unit 210 and a plurality of objects 220.

The hybrid touch buttons 200 and the central control unit 210 can be combined to form at least two structures, and one structure thereof is as follows:

each hybrid touch button 200 has a touch display unit and a mechanical switch, wherein the touch display unit has a touch display area, and the mechanical switch has a plurality of conductive contacts; the central control unit 210 coupled with the plurality of hybrid touch buttons 200, having a power interface for coupling with a power source, a first interface for driving the touch display area of each of the plurality of hybrid touch buttons, a second interface coupled with the plurality of conductive contacts of the mechanical switch of each of the plurality of hybrid touch buttons, and an output interface, wherein the central control unit 210 derives first input information from the first interface and second input information from the second interface, and determines an output configuration of the output interface according to the first input information and the second input information to control a plurality of objects 220.

Another structure thereof is as follows:

each hybrid touch button 200 includes: a touch display unit having a touch display area; a mechanical switch having a plurality of conductive contacts; and a control unit, having a power interface for coupling with a power source, a first interface for driving the touch display area, a second interface coupled with the plurality of conductive contacts, and an output interface, wherein the control unit derives first input information from the first interface and second input information from the second interface, and determines an output configuration of the output interface according to the first input information and the second input information; the central control unit 210 is coupled with the plurality of hybrid touch buttons 200 and a plurality of objects 220 to receive touch operation information from the plurality of hybrid touch buttons 200 and controls the plurality of objects 220 according to the touch operation information.

Figure 11:
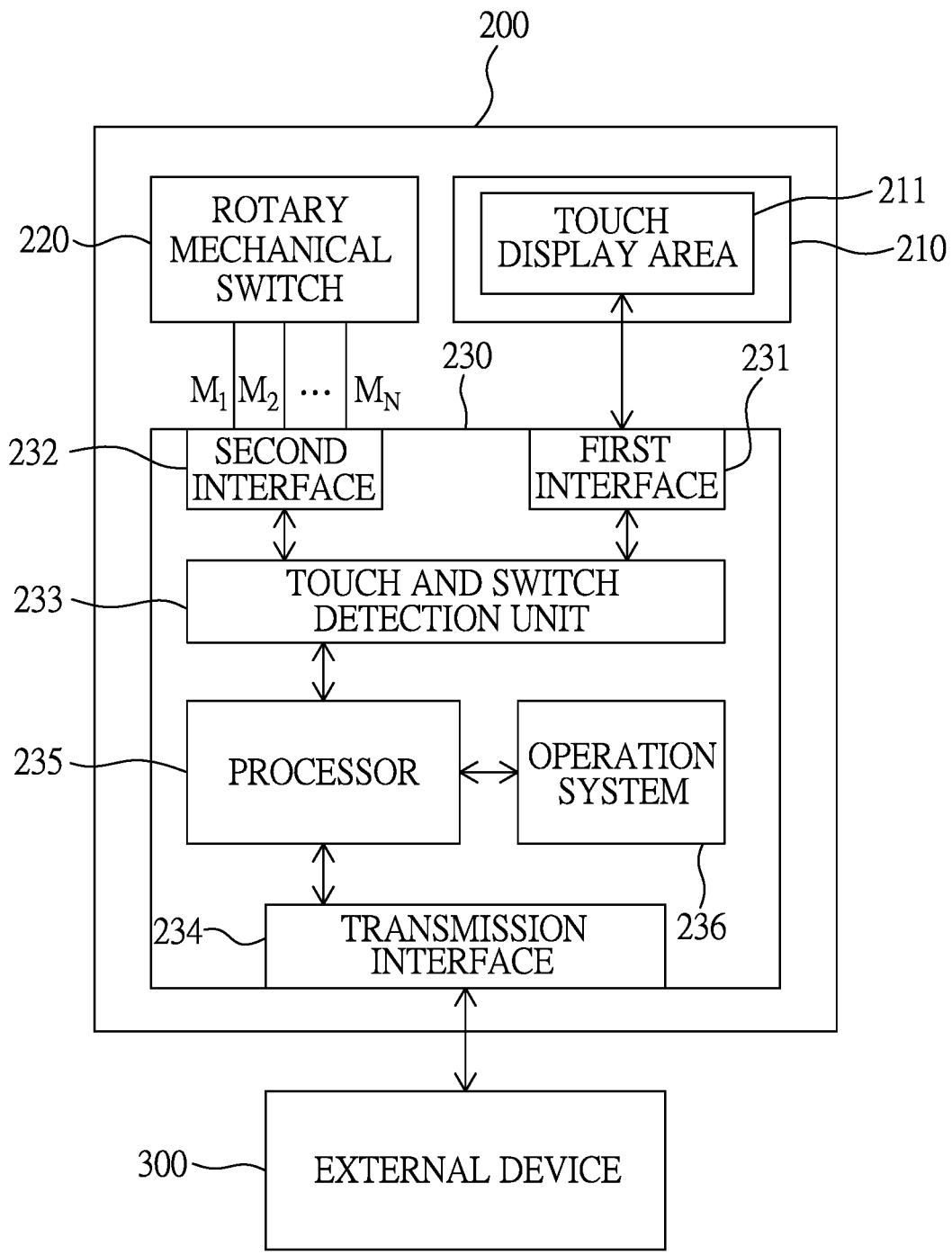
FIG. 11 illustrates a block diagram of a hybrid touch button according to another embodiment of the present invention.

Please refer to FIG. 11, which illustrates a block diagram of an intelligent hybrid touch display device according to another embodiment of the present invention. As illustrated in FIG. 11, the intelligent hybrid touch display device includes a body 200, a touch display unit 210, a rotary mechanical switch 220, and a control unit 230.

The touch display unit 210 includes a touch display area 211, which includes a display layer and a touch sensing layer (not shown in the figure), the display layer can be an active-matrix liquid crystal display layer, a passive-matrix liquid crystal display layer, an active-matrix organic light emitting diode display layer, a passive-matrix organic light emitting diode display layer, an active-matrix quantum-dot light emitting diode display layer, a passive-matrix quantum-dot light emitting diode display layer, an active-matrix micro light emitting diode display layer, a passive-matrix micro light emitting diode display layer, an active-matrix electronic paper display layer, or a passive-matrix electronic paper display layer. The touch sensing layer can be a capacitive touch sensing layer or a resistive touch sensing layer stacked on the display layer, or a capacitive touch sensing structure, a photo-type sensing structure, or an acoustic touch sensing structure embedded in a display structure of the display layer. The touch display unit 210 drives the touch display area 211 to provide a touch display function according to at least one pixel driving signal and at least one touch detection signal.

The rotary mechanical switch 220 can be a band switch or a jog dial switch, which is integrated in the body 200 and has at least one conductive contact $M_1$-$M_N$.

The control unit 230 is located in the body 200 and includes a first interface 231, a second interface 232, a touch and switch detection unit 233, a transmission interface 234, a processor 235 and an operating system 236 stored in a memory.

The first interface 231 is used for driving the touch display area 211; the second interface 232 is coupled with the at least one conductive contact $M_1$-$M_N$; the touch and switch detection unit 233 is coupled with the first interface 231 and the second interface 232; the transmission interface 234 is used for communicating with at least one external device 300 in a wired or wireless way; and the processor 235 is coupled with the touch and switch detection unit 233 and the transmission interface 234 for executing a control program with a support of the operating system 236, so that the touch display unit 210 and the rotary mechanical switch 220 can cooperate to provide a hybrid operation, which includes a rotation operation provided by the rotary mechanical switch 220 and a touch (or hover) operation provided by the touch display unit 210, the rotation operation being used for selecting a function option, and the touch (or hover) operation being used for activating the function option.

Besides, in a possible embodiment, the operating system 236 has an on-line-update function for receiving a program file from one of the at least one external device 300 via the transmission interface 234 to establish or update the control program. In addition, the control program can include a pixel data output procedure for driving the touch display unit 210 to display at least one operation picture, and/or driving a display screen of at least one external device 300 via the transmission interface 234.

Besides, for possible embodiments, the processor 235 and the touch and switch detection unit 233 can be located in separate integrated circuits or integrated in one integrated circuit.

Figure 12:
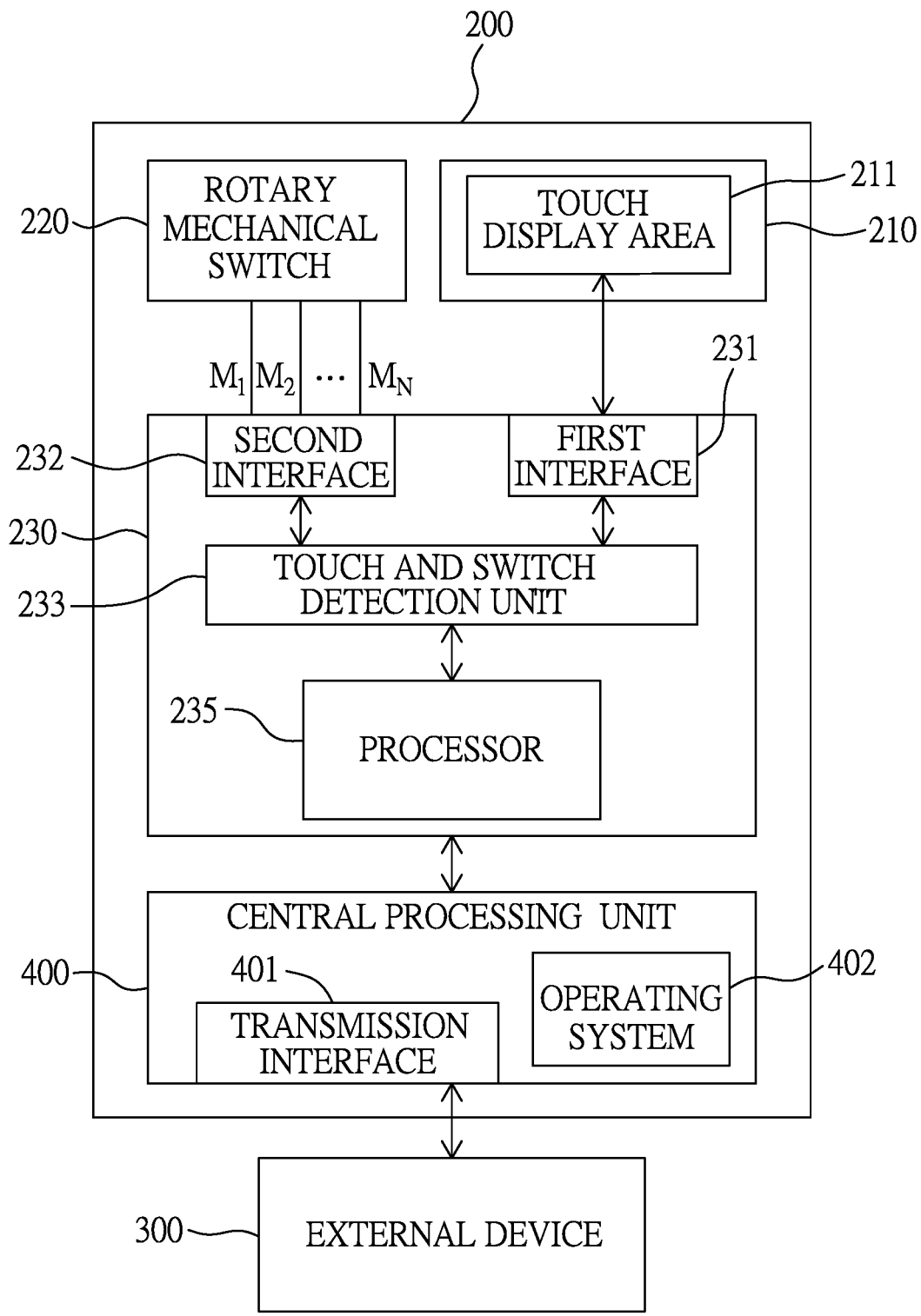
FIG. 12 illustrates a block diagram of a hybrid touch button according to another embodiment of the present invention.

Please refer to FIG. 12, which illustrates a block diagram of an intelligent hybrid touch display device according to another embodiment of the present invention. As illustrated in FIG. 12, the intelligent hybrid touch display device includes a body 200, a touch display unit 210, a rotary mechanical switch 220, a control unit 230, and a central processing unit 400.

The touch display unit 210 includes a touch display area 211, which includes a display layer and a touch sensing layer (not shown in the figure), the display layer can be an active-matrix liquid crystal display layer, a passive-matrix liquid crystal display layer, an active-matrix organic light emitting diode display layer, a passive-matrix organic light emitting diode display layer, an active-matrix quantum-dot light emitting diode display layer, a passive-matrix quantum-dot light emitting diode display layer, an active-matrix micro light emitting diode display layer, a passive-matrix micro light emitting diode display layer, an active-matrix electronic paper display layer, or a passive-matrix electronic paper display layer. The touch sensing layer can be a capacitive touch sensing layer or a resistive touch sensing layer stacked on the display layer, or a capacitive touch sensing structure, a photo-type sensing structure, or an acoustic touch sensing structure embedded in a display structure of the display layer. The touch display unit 210 drives the touch display area 211 to provide a touch display function according to at least one pixel driving signal and at least one touch detection signal.

The rotary mechanical switch 220 can be a band switch or a jog dial switch, which is integrated in the body 200 and has at least one conductive contact $M_1$-$M_N$.

The control unit 230 is located in the body 200 and includes a first interface 231, a second interface 232, a touch and switch detection unit 233, and a processor 235.

The first interface 231 is used for driving the touch display area 211; the second interface 232 is coupled with the at least one conductive contact $M_1$-$M_N$; the touch and switch detection unit 233 is coupled with the first interface 231 and the second interface 232; and the processor 235 is coupled with the touch and switch detection unit 233 for executing a control program, so that the touch display unit 210 and the rotary mechanical switch 220 can cooperate to provide a hybrid operation, which includes a rotation operation provided by the rotary mechanical switch 220 and a touch (or hover) operation provided by the touch display unit 210, the hybrid operation being used for switching pictures, selecting functions, inputting commands, setting parameters, or executing selected functions. For example, the rotation operation can be used for selecting a function option indicated by an operation picture, and the touch (or hover) operation can be used for activating the function option.

The central processing unit 400 is located in the body 200 and has a transmission interface 401 and an operating system 402 stored in a memory, the transmission interface 401 being used for communicating with at least one external device 300 in a wired or wireless way. When in operation, the central processing unit 400 operates with a support of the operating system 402 to transmit a plurality of pixel data and/or the control program to the control unit 230, generate an output configuration according to the hybrid operation detected by the control unit 230, and output the output configuration via the transmission interface 401 to control at least one external device 300.

In a possible embodiment, the central processing unit 400 can drive a display screen of at least one external device 300 via the transmission interface 401 to display an operation picture.

In addition, for possible embodiments, the control unit 230 and the central processing unit 400 can be located in separate integrated circuits or integrated in one integrated circuit.

Figure 13:
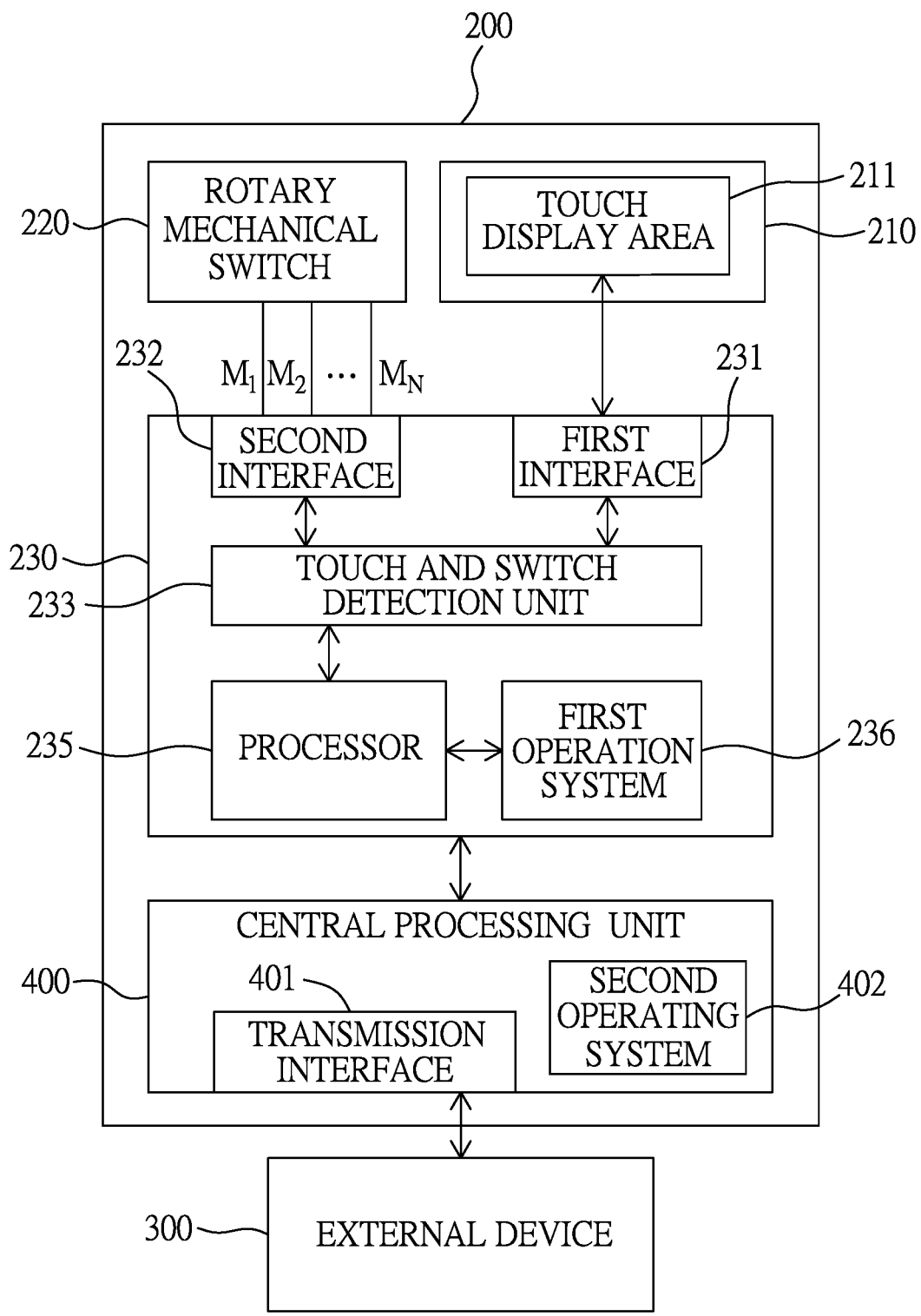
FIG. 13 illustrates a block diagram of a hybrid touch button according to still another embodiment of the present invention.

Please refer to FIG. 13, which illustrates a block diagram of an intelligent hybrid touch display device according to still another embodiment of the present invention. As illustrated in FIG. 13, the intelligent hybrid touch display device includes a body 200, a touch display unit 210, a rotary mechanical switch 220, a control unit 230, and a central processing unit 400.

The touch display unit 210 includes a touch display area 211, which includes a display layer and a touch sensing layer (not shown in the figure), the display layer can be an active-matrix liquid crystal display layer, a passive-matrix liquid crystal display layer, an active-matrix organic light emitting diode display layer, a passive-matrix organic light emitting diode display layer, an active-matrix quantum-dot light emitting diode display layer, a passive-matrix quantum-dot light emitting diode display layer, an active-matrix micro light emitting diode display layer, a passive-matrix micro light emitting diode display layer, an active-matrix electronic paper display layer, or a passive-matrix electronic paper display layer. The touch sensing layer can be a capacitive touch sensing layer or a resistive touch sensing layer stacked on the display layer, or a capacitive touch sensing structure, a photo-type sensing structure, or an acoustic touch sensing structure embedded in a display structure of the display layer. The touch display unit 210 drives the touch display area 211 to provide a touch display function according to at least one pixel driving signal and at least one touch detection signal.

The rotary mechanical switch 220 can be a band switch or a jog dial switch, which is integrated in the body 200 and has at least one conductive contact $M_1$-$M_N$.

The control unit 230 is located in the body 200 and includes a first interface 231, a second interface 232, a touch and switch detection unit 233, a processor 235 and a first operation system 236 stored in a first memory.

The first interface 231 is used for driving the touch display area 211; the second interface 232 is coupled with the at least one conductive contact $M_1$-$M_N$; the touch and switch detection unit 233 is coupled with the first interface 231 and the second interface 232 for receiving sensed signals to detect a touch (or hover) operation on the touch display area 211 and/or a rotation operation on the rotary mechanical switch 220; and the processor 235 is coupled with the touch and switch detection unit 233 for executing a control program with a support of the first operation system 236, so that the touch display unit 210 and the rotary mechanical switch 220 can cooperate to provide a hybrid operation, which includes the rotation operation provided by the rotary mechanical switch 220 and the touch (or hover) operation provided by the touch display unit 210, the rotation operation being used for selecting a function option (for example, for adjusting a parameter, or changing an operation picture, etc.), and the touch (or hover) operation being used for activating the function option and/or entering a command represented by a gesture.

The central processing unit 400 is located in the body 200 and has a transmission interface 401 and a second operating system 402 stored in a second memory, the transmission interface 401 being used for communicating with at least one external device 300 in a wired or wireless way. When in operation, the central processing unit 400 operates with a support of the second operating system 402 to transmit a plurality of pixel data and/or the control program to the control unit 230, generate an output configuration according to the hybrid operation detected by the control unit 230, and output the output configuration via the transmission interface 401 to control at least one external device 300.

In a possible embodiment, the central processing unit 400 can drive a display screen of at least one external device 300 via the transmission interface 401 to display an operation picture.

In addition, for possible embodiments, the control unit 230 and the central processing unit 400 can be located in separate integrated circuits or integrated in one integrated circuit.

In addition, for possible embodiments, the hybrid touch button of the present invention can be used to implement an intelligent device, which can be an intelligent wearable device, an intelligent vehicle control device, or an intelligent IOT device.

Figure 14:
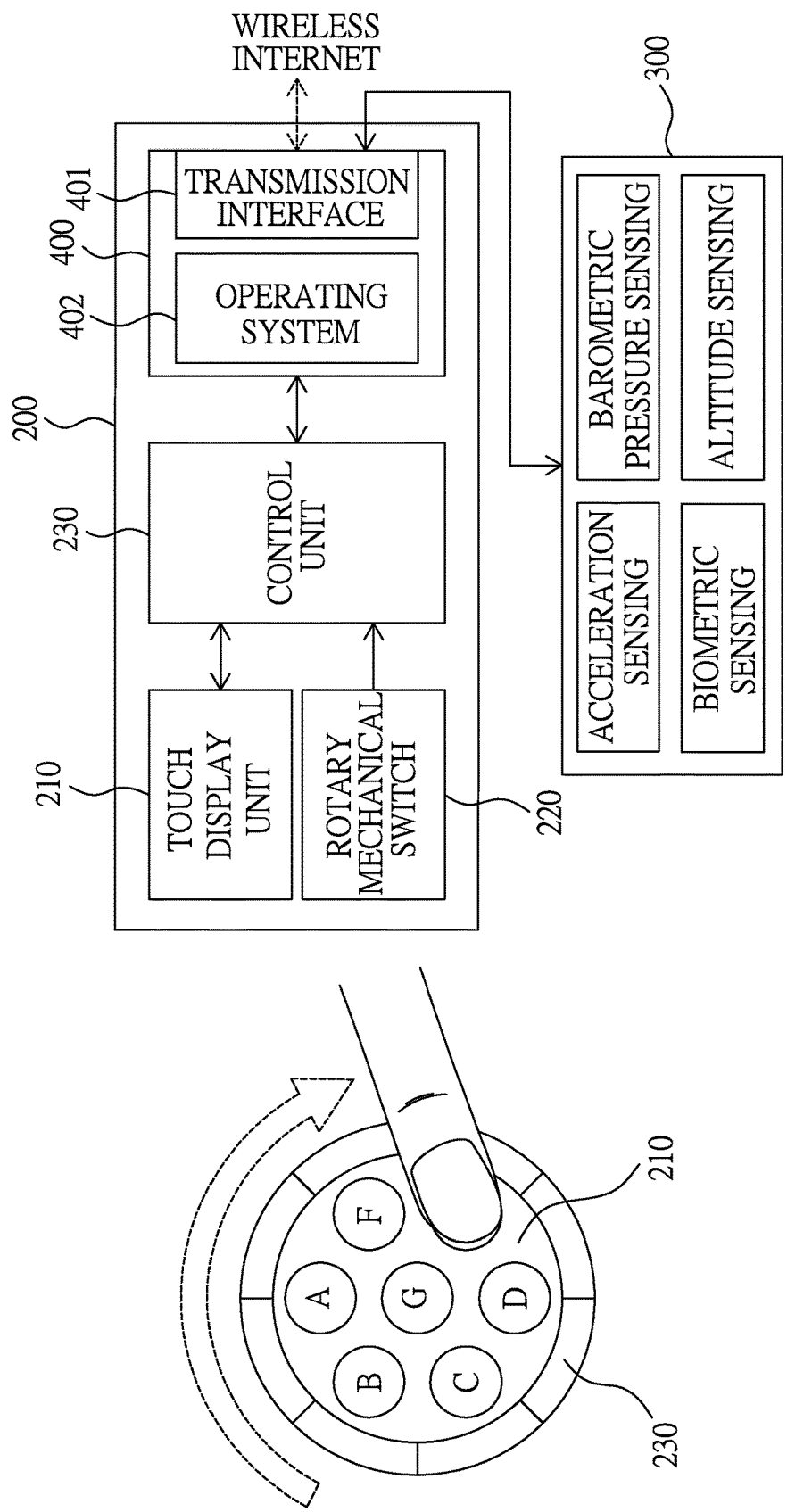
FIG. 14 is an illustrative diagram of an intelligent wearable device using the hybrid touch button of the present invention.

Please refer to FIG. 14, which shows an illustrative diagram of an intelligent wearable device using the intelligent hybrid touch display device of the present invention. As illustrated in FIG. 14, the intelligent wearable device can allow a user to select and activate an acceleration sensing function, a barometric pressure sensing function, a biometric sensing function or an altitude sensing function.

Figure 15:
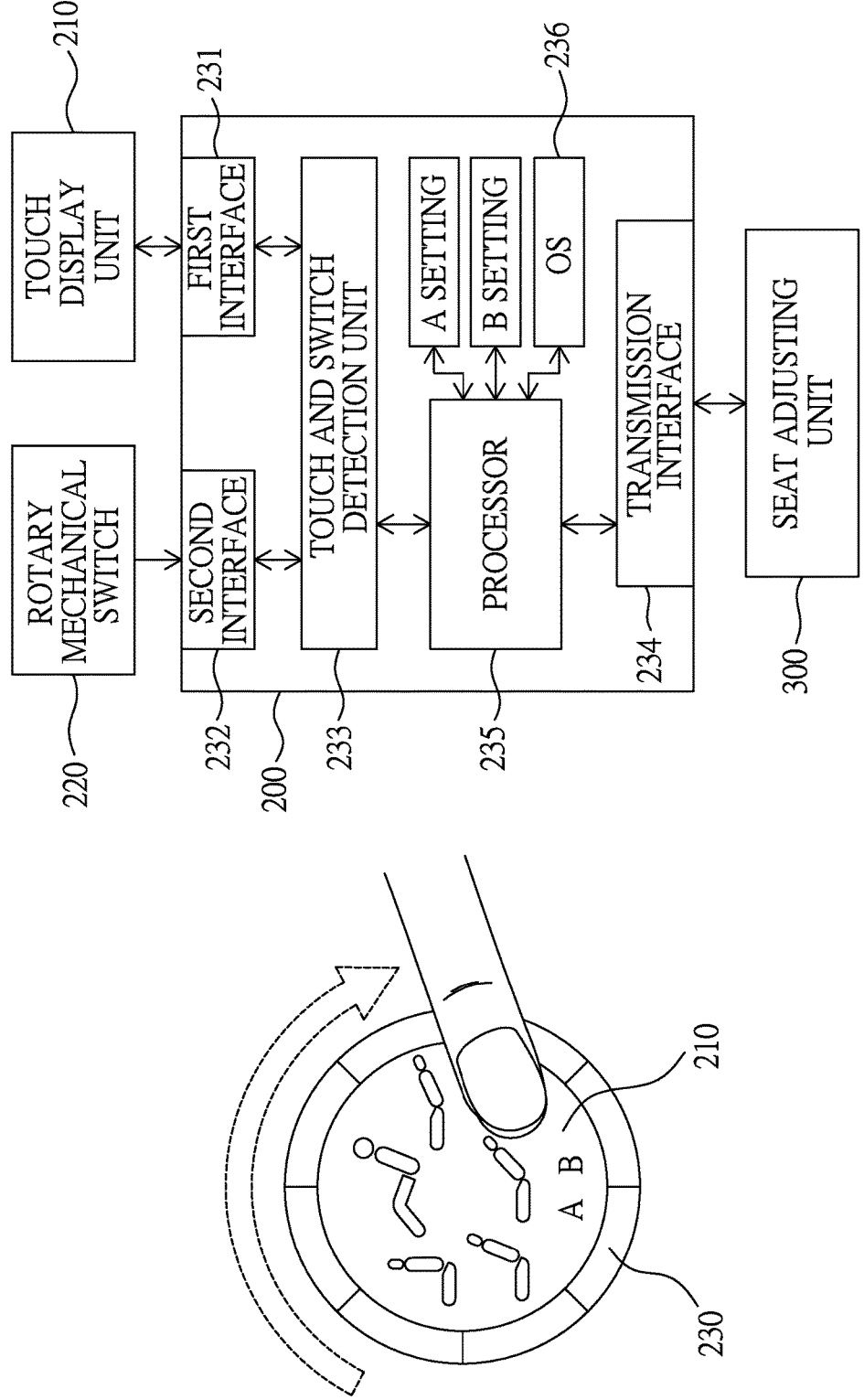
FIG. 15 is an illustrative diagram of an intelligent vehicle control device using the hybrid touch button of the present invention.

Please refer to FIG. 15, which shows an illustrative diagram of an intelligent vehicle control device using the intelligent hybrid touch display device of the present invention. As illustrated in FIG. 15, the intelligent vehicle control device can allow a user to select a seat adjusting function to drive a seat adjusting device via a CAN (Controller Area Network) BUS, the seat adjusting function including adjusting a seat location and/or a backrest angle in response to a rotation operation, and memorizing the seat location and/or the backrest angle in response to a touch operation.

Figure 16:
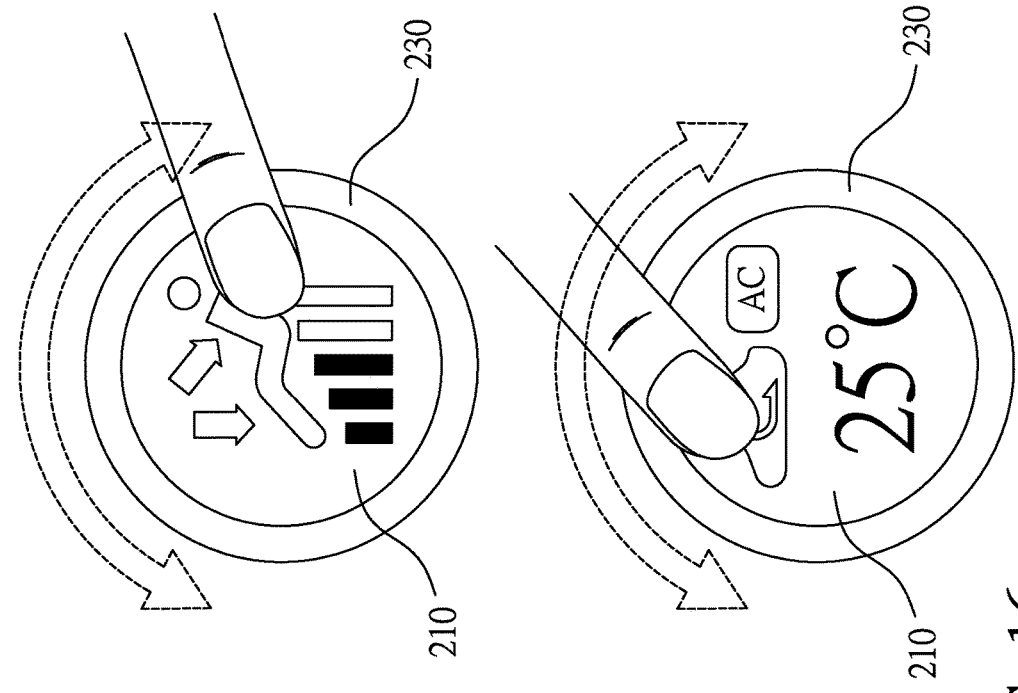
FIG. 16 is an illustrative diagram of an intelligent vehicle control device using the hybrid touch button of the present invention.
Figure 16:
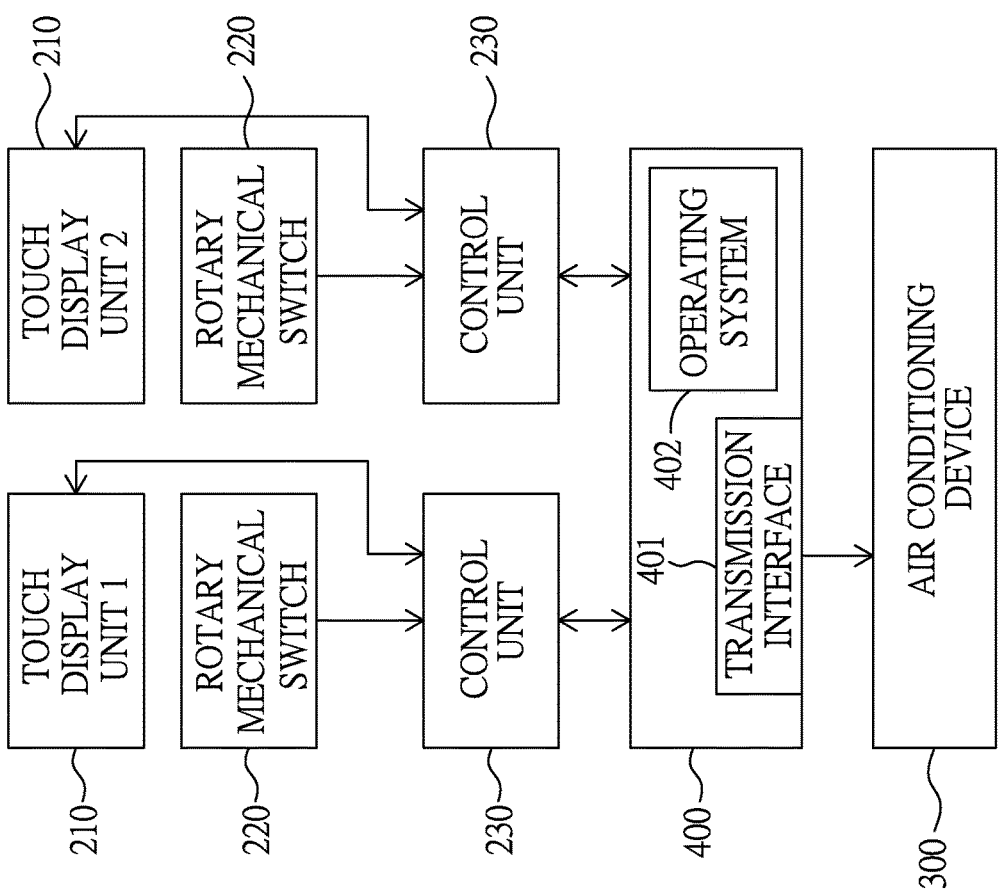

Please refer to FIG. 16, which shows an illustrative diagram of another intelligent vehicle control device using the hybrid touch button of the present invention. As illustrated in FIG. 16, the intelligent vehicle control device can allow a user to select an air condition adjusting function to drive an air conditioning device 300 via a CAN (Controller Area Network) BUS, the air condition adjusting function including adjusting a fan speed or temperature in response to a rotation operation, and changing air output locations or air modes (including re-circulate mode and fresh air mode, for example) in response to a touch operation.

In addition, by connecting the transmission interface 234 or 401 with an internet via a wired or wireless connection, the intelligent hybrid touch display device of the present invention can also be used to implement an intelligent IOT device.

Thanks to the designs mentioned above, the present invention offers the advantages as follows:

1. The hybrid touch button of the present invention can reduce the number of mechanical contacts thereof.
2. The hybrid touch button of the present invention can change the interconnection structure by software programming.
3. The hybrid touch button of the present invention can provide both a long operational life and a mechanical touch.
4. The hybrid touch button of the present invention can achieve high noise immunity by providing digital activating signals.
5. The intelligent hybrid touch display device of the present invention can provide an on-line-update function for updating an internal control program of a button.
6. The intelligent hybrid touch display device of the present invention can be used to implement an intelligent wearable device, an intelligent vehicle control device, or an intelligent IOT (internet of things) device, so as to offer a convenient operation interface for each application.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance over the conventional structure and further complies with the patent application requirements and is submitted to the Patent and Trademark Office for review and granting of the commensurate patent rights.

What is claimed is:

1. An intelligent hybrid touch display device for implementing an intelligent device, including:
   a touch display unit, having a touch display area;
   a rotary mechanical switch, which is a band switch or a jog dial switch, being integrated with the touch display unit in a body and having at least one conductive contact; and
   a control unit, located in the body and including:
   a first interface for driving the touch display area;
   a second interface for coupling with the at least one conductive contact;
   a touch and switch detection unit coupled with the first interface and the second interface for receiving sensed signals to detect a touch (or hover) operation on the touch display area and/or a rotation operation on the rotary mechanical switch;
   a transmission interface for communicating with at least one external device; and
   a processor and an operating system stored in a memory, the processor being coupled with the touch and switch detection unit and the transmission interface, and being used for executing a control program with a support of the operating system, so that the touch display unit and the rotary mechanical switch can cooperate to provide a hybrid operation, which includes the rotation operation provided by the rotary mechanical switch and the touch (or hover) operation provided by the touch display unit, the hybrid operation being used for switching pictures, selecting functions, inputting commands, setting parameters, or executing selected functions.

2. The intelligent hybrid touch display device as disclosed in claim 1, wherein the transmission interface communicates with the at least one external device in a wired or wireless way.

3. The intelligent hybrid touch display device as disclosed in claim 1, wherein the operating system has an on-line-update function for receiving a program file from one of the at least one external device to establish or update the control program.

4. The intelligent hybrid touch display device as disclosed in claim 1, wherein the control program includes a pixel data outputting procedure to make the touch display unit display at least one operation picture, and/or to drive a display screen of at least one of the at least one external device via the transmission interface.

5. The intelligent hybrid touch display device as disclosed in claim 1, wherein the processor and the touch and switch detection unit are located in separate integrated circuits or integrated in one integrated circuit.

6. The intelligent hybrid touch display device as disclosed in claim 1, wherein the touch display area includes a display layer selected from a group consisting of an active-matrix liquid crystal display layer, a passive-matrix liquid crystal display layer, an active-matrix organic light emitting diode display layer, a passive-matrix organic light emitting diode display layer, an active-matrix quantum-dot light emitting diode display layer, a passive-matrix quantum-dot light emitting diode display layer, an active-matrix micro light emitting diode display layer, a passive-matrix micro light emitting diode display layer, an active-matrix electronic paper display layer, and a passive-matrix electronic paper display layer.

7. The intelligent hybrid touch display device as disclosed in claim 6, wherein the touch display unit includes a capacitive touch sensing layer or a resistive touch sensing layer stacked on the display layer.

8. The intelligent hybrid touch display device as disclosed in claim 6, wherein the touch display unit includes a capacitive touch sensing structure, a photo-type sensing structure, or an acoustic touch sensing structure embedded in a display structure of the display layer.

9. The intelligent hybrid touch display device as disclosed in claim 1, wherein the intelligent device is an intelligent wearable device, an intelligent vehicle control device, or an intelligent IOT device.

10. An intelligent hybrid touch display device for implementing an intelligent device, including:
a touch display unit, including a touch display area for display at least one picture according to a plurality of pixel data;
a rotary mechanical switch, which is a band switch or a jog dial switch, being integrated with the touch display unit in a body and having at least one conductive contact;
a control unit, located in the body and including: a first interface for driving the touch display area; a second interface coupled with the at least one conductive contact; a touch and switch detection unit coupled with the first interface and the second interface; and a processor, being coupled with the touch and switch detection unit for executing a control program so that the touch display unit and the rotary mechanical switch can cooperate to provide a hybrid operation; and
a central processing unit, located in the body and having a transmission interface and an operating system stored in a memory, the transmission interface being used for communicating with at least one external device in a wired or wireless way;
wherein the hybrid operation includes a rotation operation provided by the rotary mechanical switch and a touch (or hover) operation provided by the touch display unit, the rotation operation being used for selecting a function option, and the touch (or hover) operation being used for activating the function option; and the central processing unit operates with a support of the operating system to transmit the plurality of pixel data and/or the control program to the control unit, generate an output configuration according to the hybrid operation detected by the control unit, and output the output configuration via the transmission interface to control at least one of the at least one external device.

11. The intelligent hybrid touch display device as disclosed in claim 10, wherein the transmission interface communicates with the at least one external device in a wired or wireless way.

12. The intelligent hybrid touch display device as disclosed in claim 10, wherein the control unit and the central processing unit are located in separate integrated circuits or integrated in one integrated circuit.

13. The intelligent hybrid touch display device as disclosed in claim 10, wherein the touch display area includes a display layer selected from a group consisting of an active-matrix liquid crystal display layer, a passive-matrix liquid crystal display layer, an active-matrix organic light emitting diode display layer, a passive-matrix organic light emitting diode display layer, an active-matrix quantum-dot light emitting diode display layer, a passive-matrix quantum-dot light emitting diode display layer, an active-matrix micro light emitting diode display layer, a passive-matrix micro light emitting diode display layer, an active-matrix electronic paper display layer, and a passive-matrix electronic paper display layer.

14. The intelligent hybrid touch display device as disclosed in claim 13, wherein the touch display unit includes a capacitive touch sensing layer or a resistive touch sensing layer stacked on the display layer.

15. The intelligent hybrid touch display device as disclosed in claim 13, wherein the touch display unit includes a capacitive touch sensing structure, a photo-type sensing structure, or an acoustic touch sensing structure embedded in a display structure of the display layer.

16. The intelligent hybrid touch display device as disclosed in claim 10, wherein the intelligent device is an intelligent wearable device, an intelligent vehicle control device, or an intelligent IOT device.

17. An intelligent hybrid touch display device for implementing an intelligent device, including:
a touch display unit, including a touch display area for display at least one picture according to a plurality of pixel data;
a rotary mechanical switch, which is a band switch or a jog dial switch, being integrated with the touch display unit in a body and having at least one conductive contact;
a control unit, located in the body and including: a first interface for driving the touch display area; a second interface coupled with the at least one conductive contact; a touch and switch detection unit coupled with the first interface and the second interface; and a processor and a first operating system stored in a first memory, the processor being coupled with the touch and switch detection unit for executing a control program with a support of the first operating system so that the touch display unit and the rotary mechanical switch can cooperate to provide a hybrid operation; and
a central processing unit, located in the body and having a transmission interface and a second operating system stored in a second memory, the transmission interface being used for communicating with at least one external device in a wired or wireless way;
wherein the hybrid operation includes a rotation operation provided by the rotary mechanical switch and a touch (or hover) operation provided by the touch display unit, the rotation operation being used for selecting a function option, and the touch (or hover) operation being used for activating the function option; and the central processing unit operates with a support of the second operating system to transmit the plurality of pixel data and/or the control program to the control unit, generate an output configuration according to the hybrid operation detected by the control unit, and output the output configuration via the transmission interface to control at least one of the at least one external device.

18. The intelligent hybrid touch display device as disclosed in claim 17, wherein the touch display area includes a display layer selected from a group consisting of an active-matrix liquid crystal display layer, a passive-matrix liquid crystal display layer, an active-matrix organic light emitting diode display layer, a passive-matrix organic light emitting diode display layer, an active-matrix quantum-dot light emitting diode display layer, a passive-matrix quantum-dot light emitting diode display layer, an active-matrix micro light emitting diode display layer, a passive-matrix micro light emitting diode display layer, an active-matrix electronic paper display layer, and a passive-matrix electronic paper display layer.

19. The intelligent hybrid touch display device as disclosed in claim 18, wherein the touch display unit includes a capacitive touch sensing layer or a resistive touch sensing layer stacked on the display layer; or includes a capacitive touch sensing structure, a photo-type sensing structure, or an acoustic touch sensing structure embedded in a display structure of the display layer.

20. The intelligent hybrid touch display device as disclosed in claim 17, wherein the intelligent device is an intelligent wearable device, an intelligent vehicle control device, or an intelligent IOT device.

* * * * *